United States Patent [19]

Joly

[11] Patent Number: 5,309,042
[45] Date of Patent: May 3, 1994

[54] FULL SWING BICMOS AMPLIFIER

[75] Inventor: Robert Joly, Vancouver, Wash.

[73] Assignee: Hewlett-Packard Company, Palo Alto, Calif.

[21] Appl. No.: 14,986

[22] Filed: Feb. 8, 1993

[51] Int. Cl.[5] ............................................. H03K 19/01
[52] U.S. Cl. .................................... 307/446; 307/570; 330/262; 330/300
[58] Field of Search ................ 307/446, 570; 330/262, 330/300

[56] References Cited

U.S. PATENT DOCUMENTS

| 4,649,294 | 3/1987 | McLaughlin | 307/446 |
| 5,138,195 | 8/1992 | Satou et al. | 307/446 |
| 5,140,190 | 8/1992 | Yoo et al. | 307/570 X |

OTHER PUBLICATIONS

K. Yano, M. Hiraki, S. Shukuri, Y. Sawahata, M. Hirao, N. Ohki, T. Nishida, K. Seki, K. Shimohigashi, *Quasi-Complementary BiCMOS for Sub-3-V Digital Circuits*, 1991 Symposium on VLSI Circuits, The Japan Society of Applied Physics/ The IEEE Solid-State Circuits Council (1991).

Primary Examiner—James B. Mullins

[57] ABSTRACT

A BiCMOS amplifier provides full swing with fast transitions from $V_{dd}$ to $V_{ss}$ and from $V_{ss}$ to $V_{dd}$, and therefore has important applications in low voltage BiCMOS VLSI circuits. A bipolar totem pole output transistor pair is connected between a supply voltage, $V_{dd}$ and ground, $V_{ss}$. A fast output transition from $V_{dd}$ to $V_{ss}$ is accomplished by extending the conduction range of the pull down bipolar transistor. An n-channel MOSFET is fabricated to provide a 0 $V_t$ pass transistor. The pass transistor is coupled to a first of the bipolar output transistor pair, the pull up transistor, to inject carriers into the base of the output transistor and extend the transistor's conduction, such that the transistor provides a fast output upswing from $V_{ss}$ to $V_{dd}$.

9 Claims, 1 Drawing Sheet

FULL SWING BICMOS AMPLIFIER

BACKGROUND OF THE INVENTION

1. Technical Field

The present invention relates to electronic circuits. More particularly, the present invention relates to electronic amplifiers.

2. Description of the Prior Art

Integrated circuits are typically fabricated in one of several different semiconductor technologies, such as bipolar, MOS, GaAs, etc. Each of these technologies offers well recognized design advantages. For example, bipolar devices are fast and capable of handling higher power levels, while MOS devices operate efficiently at low power levels.

Integrated circuit designers are increasingly exploiting the different advantages of each of these technologies by fabricating integrated circuits that include devices of more than one technology type on a common substrate. One such combination that is becoming increasingly important is that of bipolar and CMOS technologies, referred to as 'BiCMOS'. For example, it is now common practice to produce BiCMOS amplifiers.

A BiCMOS amplifier typically includes an output stage, consisting of a pair of bipolar transistors arranged in a totem pole or push-pull configuration. That is, the emitters and collectors of the transistor pair are connected in series between a supply voltage and ground terminal, with an amplifier output connected to commonly connected emitter-collector terminals of the transistor pair. The bases of the transistor pair are connected to respond to an input signal, such that the transistor pair provides an output signal having a voltage that swings between a voltage slightly less than the supply voltage and slightly more than ground. This arrangement is best understood with reference to transistors 15 and 17, as shown in FIG. 1.

It is well recognized that a full swing between a supply voltage and ground at the amplifier output is not presently possible with an amplifier of the above design. For example, if $V_{dd}$ and $V_{ss}$ are the upper and lower rail voltages respectively, then the maximum available output voltage swing is between $V_{dd}-V_{be}$ and $V_{ss+}V_{be}$, where $V_{be} \approx 0.6$ volts, i.e. $V_{be}=$ the base-emitter voltage of a bipolar transistor at the onset of conduction.

A less than full output voltage swing is not a critical problem when circuit devices are operated at higher voltages, such as 5 volts, where the devices are less sensitive to the small offsets in voltage swing that the devices themselves introduce. However, the clear trend is to produce smaller and faster devices that use less power and produce less heat. One way this is accomplished is by designing devices that operate at lower voltages, such as 4 volts, 3.3 volts, and even 2 volts. At such device operating voltages, the loss of any portion of the operating voltage swing due to the devices themselves is unacceptable.

A full swing between the supply voltage and ground can be achieved by adding MOS devices to the above amplifier circuit. The output waveform of this type of amplifier is characterized by a fast rise time from $V_{ss}$ to $V_{dd}-V_{be}$, followed by a slow rise to $V_{dd}$. Similarly, a fast transition from $V_{dd}$ to $V_{ss+}V_{be}$ is followed by a slow tail to $V_{ss}$. The steep part of this output waveform corresponds to the drive of the capacitive load by the bipolar transistors, while the slow tails result from the drive by MOS devices, which are much weaker than the bipolar transistors. Thus, although a full swing output signal may be achieved, response time is seriously degraded.

A more recent type of amplifier achieves a fast transition from $V_{dd}$ to $V_{ss}$ by extending the conduction range of the pull down bipolar transistor. However, the upgoing transition is as described above, i.e. with a slow tail to $V_{dd}$. See, for example, K. Yano, M. Hiraki, S. Shukuri, Y. Sawahata, M. Hirao, N. Ohki, T. Nishida, K. Seki, K; Shimohigashi, *Quasi-Complementary BiCMOS for Sub-3-V Digital Circuits,* 1991 Symposium on VLSI Circuits, The Japan Society of Applied Physics/The IEEE Solid-State Circuits Council (1991).

Until an amplifier having a fast response time and a full output swing from supply voltage ($V_{dd}$) to ground ($V_{ss}$), and from ground to supply voltage is available, the ability to produce useful BiCMOS integrated circuits having lower operating voltages will be limited.

SUMMARY OF THE INVENTION

The present invention provides a new type of amplifier which achieves full swing with fast transitions from $V_{dd}$ to $V_{ss}$ and from $V_{ss}$ to $V_{dd}$, and which has important applications in low voltage BiCMOS VLSI circuits.

In the preferred embodiment of the invention, a bipolar totem pole output transistor pair is connected between a supply voltage and ground, and a fast output transition from $V_{dd}$ to $V_{ss}$ is accomplished by extending the conduction range of the pull down bipolar transistor, as discussed above.

The invention provides an n-channel MOSFET that is fabricated to provide a 0 $V_t$ pass transistor. The pass transistor is coupled to a first of the bipolar output transistor pair, the pull up transistor, to inject carriers into the base of the output transistor and extend the transistor's conduction, such that the transistor provides a fast output upswing from $V_{ss}$ to $V_{dd}$.

DETAILED DESCRIPTION OF THE INVENTION

Figure 2:
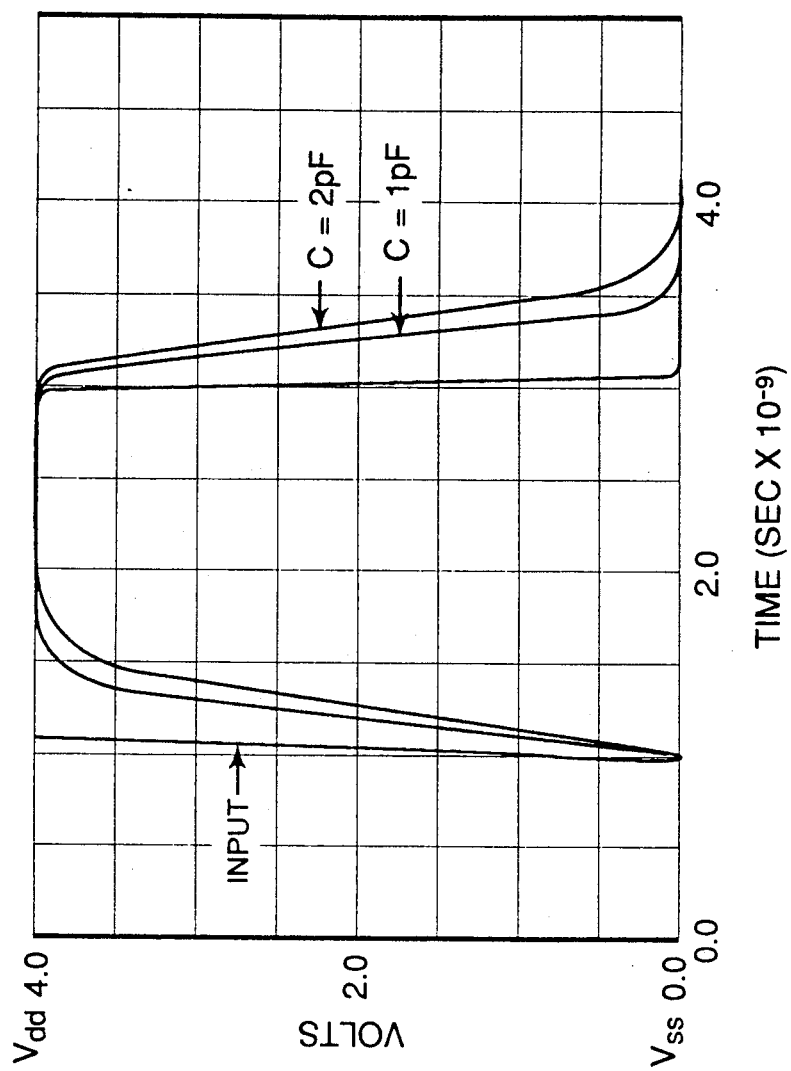
FIG. 2 is a graph showing operation of a full swing BiCMOS amplifier according to the present invention.

The present invention is best understood by referring to the Drawings in connection with review of this Description. The present invention provides a BiCMOS amplifier that is useful in a variety of applications, including high power applications, for example as a line driver amplifier. The amplifier of the present invention achieves full swing with fast transitions from $V_{dd}$ to $V_{ss}$ and from $V_{ss}$ to $V_{dd}$, and therefore has important applications in low voltage BiCMOS VLSI circuits.

Figure 1:
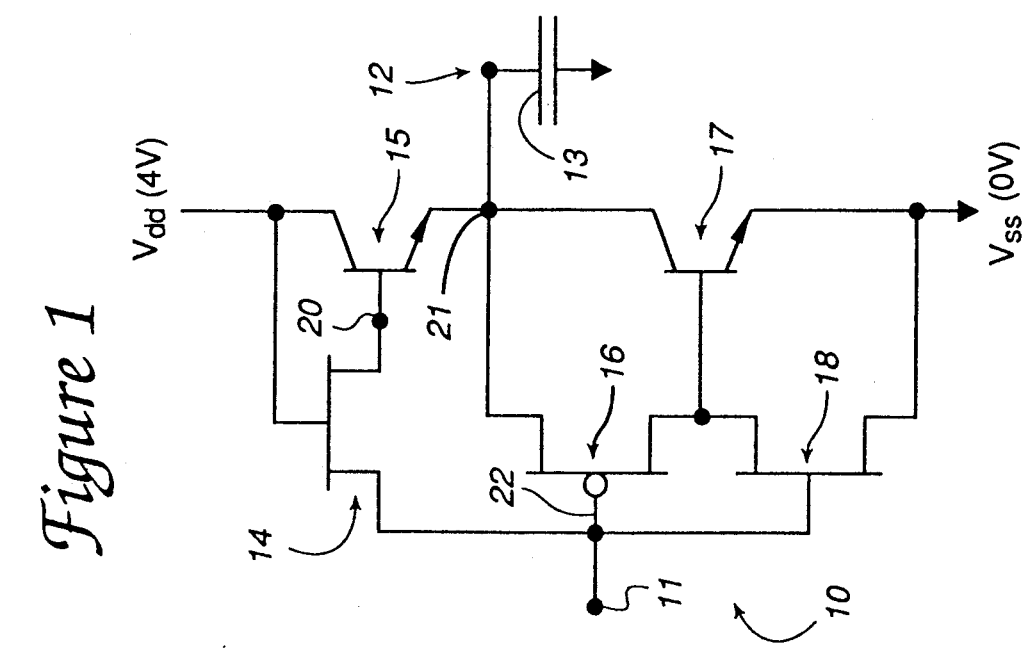
FIG. 1 is a schematic diagram of a full swing BiCMOS amplifier according to the present invention.

FIG. 1 is a schematic diagram of a BiCMOS amplifier 10 according to the preferred embodiment of the present invention. In the Fig., $V_{dd}$ (4.0 volts) and are the upper and lower rail voltages( voltage source and ground), and a capacitor 13 is shown at an output terminal 12 as a load capacitance, typically in the range of a few picoFarads ("pf"). A totem pole or push-pull bipolar transistor pair 15,17 provide an amplifier output stage. Complementary transistors 16,18 (as discussed in detail below) are configured to alternately operate one or the other of the bipolar transistor pair 15,17 in response to a signal presented at an input terminal 11. A pass transistor 14 is coupled to a first transistor 15 of the bipolar transistor pair.

The operation of the present invention is as follows. Initially, the input and output of the amplifier are low, i.e. V(IN)=V(OUT)=0. When an input signal transition occurs such that the input 11 goes high (node 22), a first MOS transistor 16 turns off, a complementary second MOS transistor 18 turns on, and a first bipolar transistor 17 is turned off by the second MOS transistor 18. The base of a second bipolar transistor 15 follows the input signal through the pass transistor 14, and the output signal (node 21) follows the base of the second bipolar transistor 15 within $V_{BE}$.

When the input signal and the base of the second bipolar transistor 15 approach $V_{dd}$, the pass transistor 14 is near cut-off and the base of the second bipolar transistor 15 becomes weakly linked to the input. Under these conditions enough carriers remain in the base of the second bipolar transistor 15 to insure that the transistor continues to conduct until the output voltage reaches $V_{dd}$ and the base (node 20) of the second bipolar transistor 15 overshoots $V_{dd}$ by $V_{BE}$.

When the input 11 goes low, the pass transistor 14 pulls the base of the second bipolar transistor 15 toward ground, the second MOS transistor 18 turns off, and the first MOS transistor 16 turns on, resulting in the activation of the first bipolar transistor 17. V(OUT) reaches about 1.0 volt, the first MOS transistor 16 is near cut-off, and the base of the first bipolar transistor 17 becomes almost isolated, allowing the first bipolar transistor 17 to continue conducting until V(OUT)=0.0 volts.

The extended conduction of the bipolar transistors 15,17 provided by the present invention is such that circuit operation may be improved by the addition of a small static circuit to keep the output at $V_{dd}$ or $V_{ss}$ over a long period of time. In some embodiments of the present invention, a weak latch (not shown), for example, is used for this purpose.

Sufficient carriers must be injected into the base of the active bipolar transistor 15,17 to insure extended conduction of the device. To accomplish such carrier injection, the first MOS transistor 16 and the pass transistor 14 must be fairly wide. For example, when the first MOS transistor 16 has a 10 μm width, instead of a 30 μm width, the output low is about 1.0 volts instead of 0.0 volts. It should be noted that producing a smaller first MOS transistor 16 and pass transistor 14, lowers the input capacitance of the amplifier. It is also important to note that it is necessary to avoid oversizing the pass transistor 14 to minimize the amount of current flowing through the transistor when V(IN)≈$V_{dd}$ and when the voltage at node $20 \approx V_{dd}+V_{BE}$ and thereby prevent turning the second bipolar transistor off before V(OUT)=$V_{dd}$.

In the preferred embodiment of the invention, an n-channel MOSFET, is fabricated without a channel implant to provide a zero volt threshold (0 $V_t$) pass transistor. The channel of a regular n-channel MOSFET is implanted with boron to adjust the threshold voltage $V_t$ to a desired value, for example 0.6 volts. The zero volt threshold transistor of the present invention, i.e. $V_{t} \approx -0.1$ volts, provides a substrate having a low concentration, and therefore a drastically reduced body effect. These characteristics imply that $V_t=0.0$ volts even when the drain, source, and gate voltages of the device are near the upper rail voltage. Except for long gate devices, zero volt threshold transistors exhibit non-negligible current under reverse bias (i.e. $V_{GS}<0$ volts). Such devices exhibit favorable characteristics under forward bias. It will be appreciated by those skilled in the art that a zero volt threshold transistor may be formed in other ways than without a channel implant. The present invention may be practiced with any zero volt threshold MOS transistor without regard to its method of fabrication.

With a normal pass transistor, the output reaches $V_{dd}$ only if a higher performance bipolar transistor is used. In some applications, it may not be advisable to use a higher performance bipolar transistor because pass transistor 14 might degrade slowly under the transient base-emitter reverse bias. The problem of pass transistor degradation does not occur when low supply voltages are used.

FIG. 2 is a SPICE simulation of the amplifier shown in FIG. 1. The simulation shown does not include a modeling of all the subthreshold currents in MOS transistors (i.e. $I_D=0$ for $V_{GS}<V_t$ for an n-channel FET). For purposes of simulation, the addition of resistors between the drain and source of transistors 14 and 16 can provide a rough improvement in the modeling of the threshold current.

In FIG. 2, an input signal presented to the amplifier input terminal 11 is plotted against a first output signal, in which the output capacitance C (13) is 2 pf; and a second outut signal, in which output capacitance C (13) is 1 pf. It can be seen from the Fig. that the choice of output capacitance slightly affects output rise and decay times, and thus overall circuit response time. The Fig. also shows that the present invention operates to provide rapid response to input signals, both in upswing ($V_{ss}$ to $V_{dd}$) and downswing ($V_{dd}$ to $V_{ss}$) transitions; and, at the same time, provides a full swing output signal.

Although the invention is described herein with reference to the preferred embodiment, one skilled in the art will readily appreciate that other applications may be substituted for those set forth herein without departing from the spirit and scope of the present invention. For example, the present invention may be practiced with both NPN and PNP bipolar transistors, etc. Accordingly, the invention should only be limited by the Claims included below.

I claim:

1. A full swing BiCMOS amplifier, comprising:
   a pull-up bipolar transistor and a pull-down bipolar transistor coupled as a totem pole pair between a voltage source $V_{dd}$ and a voltage sink $V_{ss}$;
   a first MOS transistor connected to said pull-down bipolar transistor to extend conduction of the pull-down bipolar transistor and thereby enable a fast output downswing from $V_{dd}$ to $V_{ss}$; and
   a a zero volt threshold (0 $V_{be}$) transistor connected said pull-up transistor to extend conduction of the pull-up transistor by injecting carriers into a base terminal of the pull-up transistor and thereby enable a fast output upswing from $V_{ss}$ to $V_{dd}$.

2. The amplifier of claim 1, said zero volt threshold transistor further comprising:
   an n-channel MOSFET fabricated without a channel implant.

3. The amplifier of claim 1, wherein said first MOS transistor includes a first terminal coupled to an amplifier input terminal; a second terminal coupled between an emitter terminal of said pull-up bipolar transistor and a collector terminal of said pull-down bipolar transistor;

and a third terminal coupled to a base terminal of said pull-down bipolar transistor.

4. The amplifier of claim 1, wherein said zero volt threshold transistor includes a first terminal coupled to an amplifier input terminal; a second terminal coupled to $V_{dd}$ and a collector terminal of said pull-up bipolar transistor; and a third terminal coupled to a base of said pull-up bipolar transistor.

5. In a full swing BiCMOS amplifier, including a pull-up bipolar transistor and a pull-down bipolar transistor coupled as a totem pole pair between a voltage source $V_{dd}$ and a voltage sink $V_{ss}$, a pass transistor, comprising:
   a zero volt threshold MOS device that includes a first terminal coupled to an amplifier input terminal; a second terminal coupled to said voltage source $V_{dd}$ and a first terminal of said pull-up bipolar transistor; and a third terminal coupled to a control terminal of said pull-up bipolar transistor;
   wherein said pass transistor extends conduction of the pull-up transistor by injecting carriers into a base terminal of said pull-up transistor, and thereby enable a fast output upswing from $V_{ss}$ to $V_{dd}$.

6. The amplifier of claim 5, wherein said pull-up transistor includes a second terminal coupled to an amplifier output terminal and wherein said pull-down transistor includes a first terminal coupled to said amplifier output terminal and said pull-up transistor second terminal, a second terminal coupled to said voltage sink $V_{ss}$, and a control terminal coupled to an amplifier input terminal.

7. The amplifier of claim 6, further comprising:
   a first MOS transistor, including a first terminal coupled to said amplifier input terminal; a second terminal coupled between said second terminal of said pull-up bipolar transistor and said first terminal of said pull-down bipolar transistor; and a third terminal coupled to said control terminal of said pull-down bipolar transistor.

8. A full swing BiCMOS amplifier, comprising:

a pull-up transistor, including a collector terminal coupled to said voltage source $V_{dd}$, an emitter terminal coupled to an amplifier output terminal, and a base terminal;
   a pull-down transistor, including a collector terminal coupled to said amplifier output terminal and said pull-up transistor emitter terminal, an emitter terminal coupled to said voltage sink $V_{ss}$, and a base terminal, wherein said pull-up bipolar transistor and a pull-down bipolar transistor comprise a totem pole pair coupled between said voltage source $V_{dd}$ and said voltage sink $V_{ss}$;
   a first MOS transistor, including a gate terminal coupled to an amplifier input terminal; a source terminal coupled between said emitter terminal of said pull-up bipolar transistor and said collector terminal of said pull-down bipolar transistor; and a drain terminal coupled to said base terminal of said pull-down bipolar transistor;
   a second MOS transistor having a drain terminal coupled to said pull-down transistor base terminal and said first MOS transistor drain terminal; a gate terminal coupled to said amplifier input terminal; and a source terminal coupled to said voltage sink $V_{ss}$; and
   a pass transistor, including a source terminal coupled to said amplifier input terminal; a gate terminal coupled to said voltage source $V_{dd}$ and said collector terminal of said pull-up bipolar transistor; and a drain terminal coupled to said base terminal of said pull-up bipolar transistor;
   wherein said pass transistor comprises a zero volt threshold MOS device that extends conduction of the pull-up transistor by injecting carriers into said base terminal of said pull-up transistor, and thereby enable the pull-up transistor to provide a fast output upswing from $V_{ss}$ to $V_{dd}$.

9. The amplifier of claim 8, wherein said pass transistor in an n-channel MOSFET fabricated to exhibit a zero threshold voltage.

* * * * *